United States Patent
Badger, II et al.

(10) Patent No.: US 12,253,568 B2
(45) Date of Patent: Mar. 18, 2025

(54) CHARGE TIME ESTIMATING METHOD AND SYSTEM

(71) Applicant: Ford Global Technologies, LLC, Dearborn, MI (US)

(72) Inventors: Charles Everett Badger, II, Westland, MI (US); Dima Alame, Windsor (CA)

(73) Assignee: Ford Global Technologies, LLC, Dearborn, MI (US)

( * ) Notice: Subject to any disclaimer, the term of this patent is extended or adjusted under 35 U.S.C. 154(b) by 419 days.

(21) Appl. No.: 17/738,197

(22) Filed: May 6, 2022

(65) Prior Publication Data
US 2023/0358820 A1    Nov. 9, 2023

(51) Int. Cl.
*G01R 31/387* (2019.01)
*B60L 58/12* (2019.01)
*G01R 31/36* (2020.01)

(52) U.S. Cl.
CPC ............ *G01R 31/387* (2019.01); *B60L 58/12* (2019.02); *G01R 31/3646* (2019.01); *B60L 2240/54* (2013.01)

(58) Field of Classification Search
None
See application file for complete search history.

(56) References Cited

U.S. PATENT DOCUMENTS

| 10,444,290 B2* | 10/2019 | Kawamura | B60L 58/20 |
| 11,840,157 B2* | 12/2023 | Bennett | B60L 58/12 |
| 2009/0212745 A1* | 8/2009 | Kelty | B60L 3/0092 320/162 |
| 2011/0175452 A1* | 7/2011 | Hoshino | H02J 9/005 307/66 |
| 2015/0326037 A1* | 11/2015 | Borhan | H01M 10/44 320/162 |
| 2016/0047862 A1* | 2/2016 | Shimizu | G06Q 20/145 702/63 |
| 2016/0129803 A1* | 5/2016 | Grewal | B60W 40/13 701/123 |
| 2018/0345800 A1* | 12/2018 | Beer | B60L 53/18 |
| 2020/0373779 A1 | 11/2020 | Arizono | |
| 2021/0362616 A1* | 11/2021 | Stichowski | B60L 58/16 |
| 2022/0271557 A1* | 8/2022 | Tseng | H02J 7/0071 |
| 2023/0001818 A1* | 1/2023 | Shaotran | B60L 53/305 |

FOREIGN PATENT DOCUMENTS

| CN | 107240728 A | 10/2017 |
| CN | 108646190 B | 1/2021 |
| CN | 111999660 B | 10/2021 |

* cited by examiner

*Primary Examiner* — Elias Desta
(74) *Attorney, Agent, or Firm* — David B. Kelley; Carlson, Gaskey & Olds, P.C.

(57) ABSTRACT

A strategy selection method for estimating a charge time includes, when a target state of charge for a traction battery is a full charge, establishing an estimated time required to charge the traction battery using a first strategy, and when a target state of charge for the traction battery is less than a full charge, establishing the estimated time required to charge the traction battery using a different, second strategy.

20 Claims, 2 Drawing Sheets

CHARGE TIME ESTIMATING METHOD AND SYSTEM

TECHNICAL FIELD

This disclosure relates generally to estimating a time required to charge a traction battery of an electrified vehicle.

BACKGROUND

Electrified vehicles differ from conventional motor vehicles because electrified vehicles include a drivetrain having one or more electric machines. The electric machines can drive the electrified vehicles instead of, or in addition to, an internal combustion engine. A traction battery can power the electric machines. The traction battery can include one or more battery modules within an enclosure. The traction battery modules can each include a plurality of individual battery cells.

SUMMARY

In some aspects, the techniques described herein relate to a strategy selection method for estimating a charge time, including: when a target state of charge for a traction battery is a full charge, establishing an estimated time required to charge the traction battery using a first strategy; and when a target state of charge for the traction battery is less than a full charge, establishing the estimated time required to charge the traction battery using a different, second strategy.

In some aspects, the techniques described herein relate to a method, wherein the full charge is a one-hundred percent state of charge.

In some aspects, the techniques described herein relate to a method, wherein the first strategy includes: estimating an amount of energy required to charge a traction battery; subtracting calibrated energy losses from an amount of incoming charging power to establish an available charging power; and dividing the amount of energy by the available charging power.

In some aspects, the techniques described herein relate to a method, wherein the second strategy includes: communicating the target state of charge from a first control module to a second control module that is different than the first control module; using the second control module to establish an estimated amount of energy that is needed to charge the traction battery to the target state of charge; communicating the estimated amount of energy from the second control module to the first control module; and using the first control module to establish the estimated time required to charge the traction battery to the target state of charge, the estimated time at least partially based on the estimated amount of energy.

In some aspects, the techniques described herein relate to a method, wherein the first control module is a powertrain control module.

In some aspects, the techniques described herein relate to a method, wherein the second control module is a battery energy control module.

In some aspects, the techniques described herein relate to a method, wherein the second control module is configured to calculate a state of charge of the traction battery.

In some aspects, the techniques described herein relate to a method, wherein the second strategy includes: communicating the target state of charge from a first control module to a second control module that is different than the first control module; using the second control module to establish an estimated amount of energy that is needed to charge the traction battery to the target state of charge; communicating the estimated amount of energy from the second control module to the first control module; and using the first control module to establish the estimated time required to charge the traction battery to the target state of charge, the estimated time at least partially based on the estimated amount of energy.

In some aspects, the techniques described herein relate to a charge time estimating system, including: a traction battery; and at least one control module that establishes an estimated time required to charge the traction battery using a first strategy when a target state of charge for a traction battery is a full charge, and that establishes the estimated time required to charge the traction battery using a different, second strategy when the target state of charge for the traction battery is less than a full charge.

In some aspects, the techniques described herein relate to a system, wherein the full charge is a one-hundred percent state of charge.

In some aspects, the techniques described herein relate to a system, wherein, when using the first strategy, the at least one control module establishes the estimated time required to charge the traction battery by estimating an amount of energy required to charge a traction battery, subtracting calibrated energy losses from an amount of incoming charging power to establish an available charging power, and dividing the amount of energy by the available charging power.

In some aspects, the techniques described herein relate to a system, wherein the at least one control module is a first control module and further including a second control module, wherein, when using the second strategy, the first control module establishes the estimated time based on an estimated amount of energy that is needed to charge the traction battery to the target state of charge, the estimated amount of energy communicated to the first control module from the second control module, the second control module establishing the estimated amount of energy based on the target state of charge.

In some aspects, the techniques described herein relate to a system, wherein, when using the second strategy, the first control module communicates the target state of charge to the second control module.

In some aspects, the techniques described herein relate to a system, wherein the first control module is outside and enclosure of the traction battery, and the second control module is inside the traction battery.

In some aspects, the techniques described herein relate to a system, wherein the first control module is a hybrid powertrain control module.

In some aspects, the techniques described herein relate to a system, wherein the second control module is a battery energy control module.

In some aspects, the techniques described herein relate to a system, wherein the target state of charge is less than a full charge.

In some aspects, the techniques described herein relate to a system, further including a display that shows an actual state of charge of the traction battery.

In some aspects, the techniques described herein relate to a system, further including an electrified vehicle having the traction battery and the at least one control module.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure details exemplary methods and systems for estimating a time required to charge a traction battery to a target state of charge. The estimated charge times can be used to, for example, facilitate reaching the target state of charge at a certain time, or when calculating whether charging should start or stop (e.g., trying to charge during off-peak times). The target state of charge can be less than a full charge (i.e., less than 100%).

In the past, estimating the time required to charge the traction battery did not rely on some types of information, such as an age of components.

Figure 1:
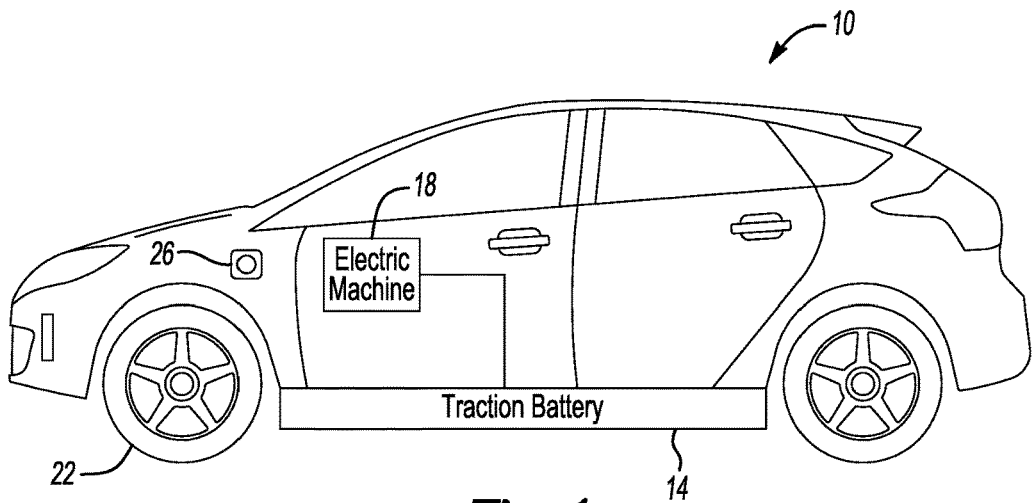
FIG. 1 illustrates a side view of an electrified vehicle having a traction battery.

With reference to FIG. 1, an electrified vehicle 10 includes a traction battery 14, an electric machine 18, and wheels 22. The traction battery 14 powers the electric machine 18, which converts electrical power to torque to drive the wheels 22.

The electrified vehicle 10 includes a charge port 26. The electrified vehicle 10 can be electrically coupled an external power source through the charge port 26. The traction battery 14 can be recharged from the external power source.

The traction battery 14 is, in the exemplary embodiment, secured to an underbody of the electrified vehicle 10. The traction battery 14 could be located elsewhere on the electrified vehicle 10 in other examples.

The electrified vehicle 10 is an all-electric vehicle. In other examples, the electrified vehicle 10 is a hybrid electric vehicle, which can selectively drive wheels using torque provided by an internal combustion engine instead, or in addition to, an electric machine. Generally, the electrified vehicle 10 can be any type of vehicle having a traction battery.

Figure 2:
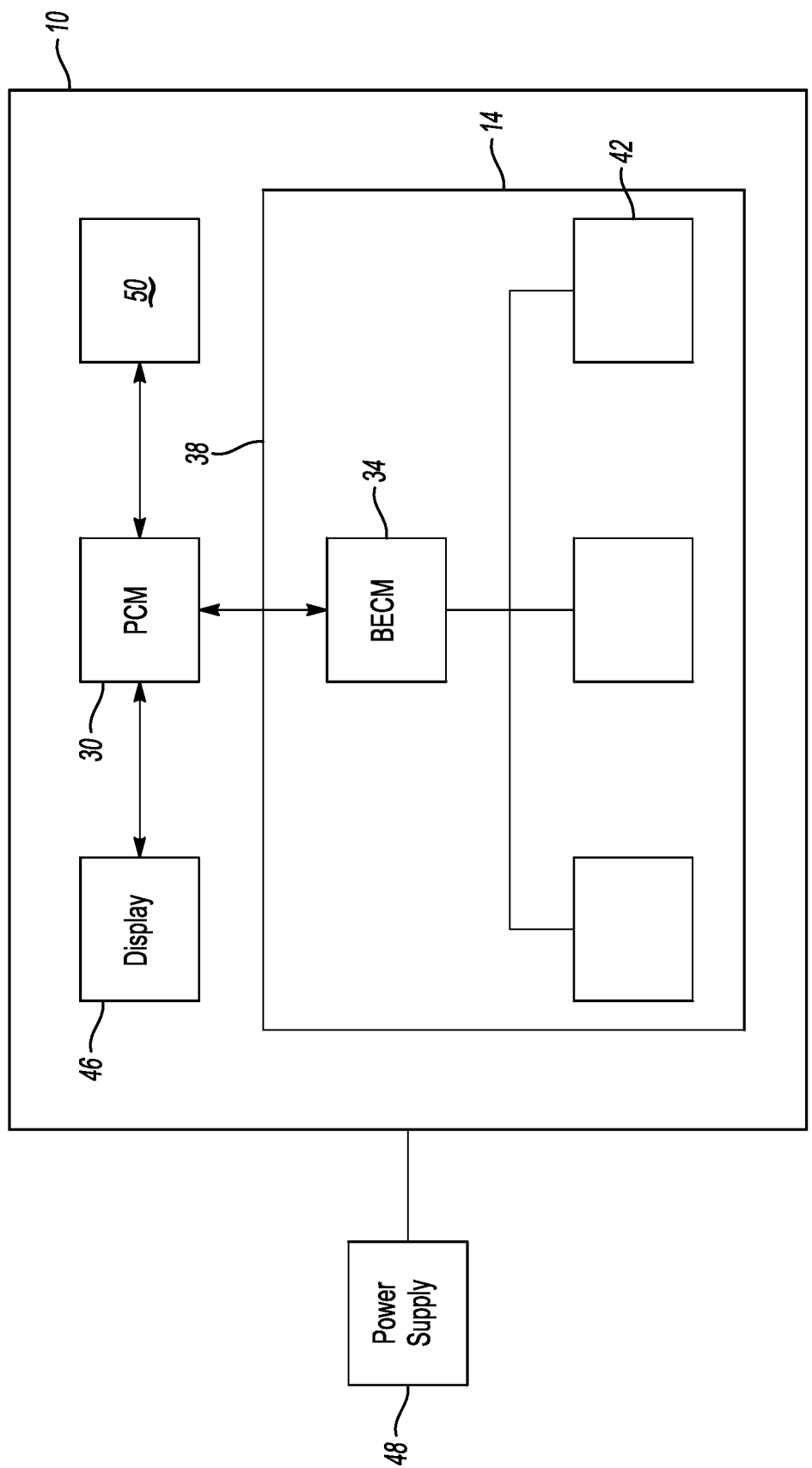
FIG. 2 illustrates a schematic side view of selected portions of the electrified vehicle of FIG. 1.

With reference now to FIG. 2, the electrified vehicle 10 includes a first control module 30 and a different, second control module 34. The first control module 30 is in communication with the second control module 34.

In the exemplary embodiment, the first control module 30 is an electronic control module (ECM) or powertrain control module (PCM), and the second control module 34 is a battery energy control module (BECM). In some examples, the first control module 30 could be a hybrid powertrain control module (HPCM)—a type of powertrain control module.

The first control module 30 and the second control module 34 are control modules of the electrified vehicle 10. The first control module 30 is within the electrified vehicle 10, but separate from the traction battery 14. The second control module 34 is part of the traction battery 14 in this example. The first control module 30 is configured to provide charge programming for traction battery 14. That is, the first control module 30 starts and stops charging of the traction battery 14.

In particular, the second control module 34 is housed within an enclosure 38 of the traction battery 14 along with a plurality of battery arrays 42. Each of the traction battery arrays 42 can include a plurality of individual battery cells.

The second control module 34 is operatively connected to each of the traction battery arrays 42. The second control module 34 is configured to control various functions of the traction battery 14, to report a status of the traction battery 14, etc.

The second control module 34 is, in this example, in communication with a display 46 of the electrified vehicle 10. The display 46 is an in-vehicle display. The display 46 could instead, or additionally, be incorporated into a user device, such as a tablet or smartphone.

The second control module 34 can continually assess an actual state of charge of the traction battery 14 and can continually report out the actual state of charge to first control module 30, which can then command the actual state of charge to be shown on the display 46. A user of the electrified vehicle 10 can view the actual state of charge of the traction battery 14 on the display 46.

The first control module 30 and the second control module 34 can each include a processor, memory, and one or more input and/or output (I/O) device interface(s) that are communicatively coupled via a local interface. The local interface can include, for example, one or more buses and/or other wired or wireless connections. The local interface may have additional elements, which are omitted for simplicity, such as controllers, buffers (caches), drivers, repeaters, and receivers to enable communications. Further, the local interface may include address, control, and/or data connections to enable appropriate communications among the aforementioned components.

The first control module 30 and the second control module 34 can each be a hardware device for executing software, particularly software stored in memory. The first control module 30 and second control module 34 can each include a custom-made or commercially available processor, a central processing unit (CPU), an auxiliary processor among several processors associated with the computing device, a semiconductor based microprocessor (in the form of a microchip or chip set) or generally any device for executing software instructions. The software in the memory may include one or more separate programs, each of which includes an ordered listing of executable instructions for implementing logical functions. The first control module 30 and the second control module 34 can each be configured to execute software stored within the memory, to communicate data to and from the memory, and to generally control operations of the computing device pursuant to the software.

FIG. 2 schematically shows the electrified vehicle 10 being operatively connected to a power supply 48 that is outside the electrified vehicle 10. The power supply 48 can be a charging station. The power supply 48 can charge the traction battery 14 to a desired state of charge. The first control module 30 can stop and start the charging.

The first control module 30 can control charging of the traction battery 14 from the power supply 48. The traction battery 14 can be fully charged from the power supply 48. A full charge is nominally a one-hundred percent state of charge for the traction battery 14. From time to time, it can be desirable to charge the traction battery 14 a state of charge that is less than a full charge, say a 90% state of charge.

In the exemplary embodiment, the first control module 30 is relied on, at least in part, to establish a time required to charge the traction battery 14 to a target state of charge. The first control module 30 varies how the time required to charge is calculated based on whether the target state of charge is a full charge or is less than a fully charge.

Figure 3:
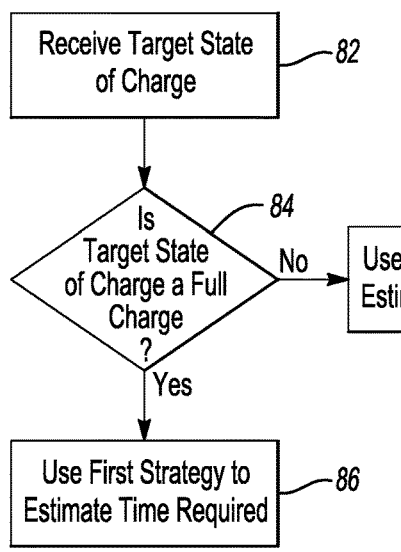
FIG. 3 illustrates a flow of an example strategy selection method for estimating a charge time.

With reference now to FIG. 3 and continuing reference to FIG. 2, a strategy selection method 80 for estimating a charge time for the traction battery 14 begins at a step 82 where the target state of charge is received. Next, at a step 84, the method 80 assesses whether the target state of charge is a full charge. If yes, the method 80 moves to a step 86 where the first control module 30 establishes the estimated time required to charge the traction battery 14 using a first strategy. If no, the method 80 moves to a step 88 where the first control module 30 when a target state of charge for the traction battery is less than a full charge, establishing the estimated time required to charge the traction battery using a different, second strategy.

The first strategy, in this example, includes estimating a time required to charge the traction battery 14 by estimating an amount of energy required to charge the traction battery 14, subtracting calibrated energy losses from an amount of incoming charging power to establish an available charging power, and dividing the amount of energy by the available charging power.

In the past, if the target state of charge is less than fully charged, the estimating strategy interpolated to estimate a charge time, but this strategy potentially provided inaccurate estimates, especially with a correlation between a state of charge and an amount of energy in the traction battery 14 is not linear.

Figure 4:
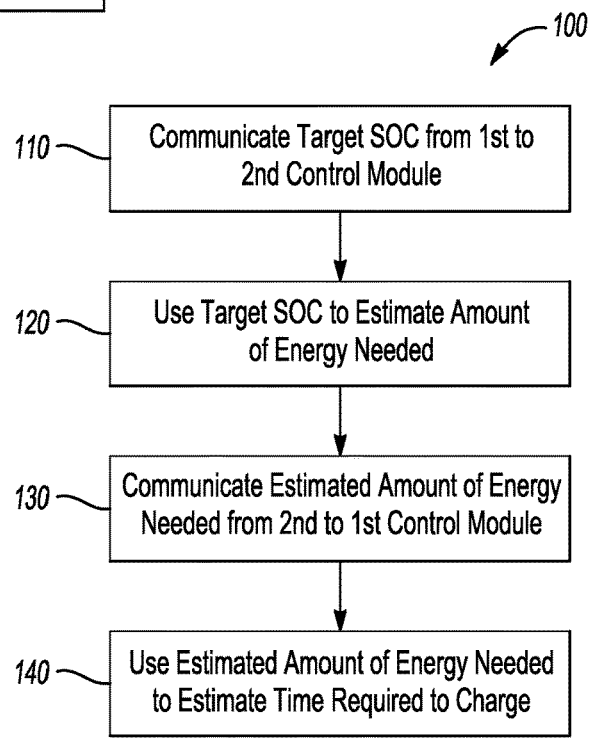
FIG. 4 illustrates the flow of an example charge time estimating method.

The second strategy, which again can be used when the target state of charge is less than fully charged, can be described with reference to FIG. 4 and continued reference to FIGS. 2 and 3. The second strategy for estimate a charge time is a charge time estimating method 100. The method 100 begins at a step 110 where a target state of charge for the traction battery 14 is communicated from the first control module 30, here the PCM, to the second control module 34, here the BECM. The target state of charge can be stored in a memory portion of the first control module 30. The target state of charge can vary based on an estimated key-on or "go" time for the electrified vehicle 10, weather conditions, location of the electrified vehicle 10 (e.g., work or home), a price for charging from the power supply 48, a time of day, etc.

The target state of charge could be provided to the first control module 30 by a user utilizing an input device 50, such as a human machine interface within the electrified vehicle 10. In another example, the input device 50 could be a smart device, such as a tablet or smartphone.

Next, at a step 120, the second control module 34 uses the target state of charge received from the first control module 30 to establish an estimated amount of energy needed to charge the traction battery 14 to the target state of charge. The second control module 34 could establish the amount of energy utilizing various strategies that involve correlating a given amount of energy to a given state of charge. The second control module 34 could, for example, utilize simple linear interpolation of energy to a state of charge, temperature correction, degradation modeling, non-linear state of charge reporting, or other strategies. Correcting for temperature changes could, for example, adjust the correlating. The correlating could also be adjusted as the hardware and other components of the traction battery 14 age.

At a step 130, the estimated amount of energy needed to charge the traction battery 14 is then communicated from the second control module 34 to the first control module 30, which is outside the traction battery 14.

Next, at a step 140, the first control module 30 utilizes the estimated amount of energy received from the second control module 34 to establish an estimated time required to charge the traction battery 14 to the target state of charge. The estimated time is established at the first control module 30 based, at least in part, on the estimated amount of energy received from the second control module 34 in the step 130.

In the past, control modules outside the traction battery have estimated charge times by comparing energy within a traction battery to a total possible amount of energy within the traction battery, and then interpolating to determine how an amount of energy needed to charge the traction battery to a target state of charge. The estimated charge times did not account for the ways in which a control module of the traction battery (such as a BECM) related energy to the state of charge. This hindered the accuracy of the estimated charge time.

Utilizing the method 100 and an associated charge estimating system of the disclosed embodiments can enable the control module within the traction battery (here the BECM) to employ various strategies of correlating an energy level to a state of charge. Variation in these strategies is accounted for when calculating an estimated charge time.

The preceding description is exemplary rather than limiting in nature. Variations and modifications to the disclosed examples may become apparent to those skilled in the art that do not necessarily depart from the essence of this disclosure. Thus, the scope of protection given to this disclosure can only be determined by studying the following claims.

What is claimed is:

1. A strategy selection method for estimating a charge time, comprising:
   when a target state of charge for a traction battery is a full charge, establishing an estimated time required to charge the traction battery using a first strategy;
   when a target state of charge for the traction battery is less than a full charge, establishing the estimated time required to charge the traction battery using a different, second strategy; and
   adjusting a charging of the traction battery of the vehicle based on the estimated charge time.

2. The method of claim 1, wherein the full charge is a one-hundred percent state of charge.

3. The method of claim 1, wherein the first strategy includes:
   estimating an amount of energy required to charge a traction battery;
   subtracting calibrated energy losses from an amount of incoming charging power to establish an available charging power; and
   dividing the amount of energy by the available charging power.

4. The method of claim 3, wherein the second strategy includes:
   communicating the target state of charge from a first control module to a second control module that is different than the first control module;
   using the second control module to establish an estimated amount of energy that is needed to charge the traction battery to the target state of charge;

communicating the estimated amount of energy from the second control module to the first control module; and using the first control module to establish the estimated time required to charge the traction battery to the target state of charge, the estimated time at least partially based on the estimated amount of energy.

5. The method of claim 4, wherein the first control module is a powertrain control module.

6. The method of claim 4, wherein the second control module is a battery energy control module.

7. The method of claim 4, wherein the second control module is configured to calculate a state of charge of the traction battery.

8. The method of claim 1, wherein the second strategy includes:

communicating the target state of charge from a first control module to a second control module that is different than the first control module;

using the second control module to establish an estimated amount of energy that is needed to charge the traction battery to the target state of charge;

communicating the estimated amount of energy from the second control module to the first control module; and using the first control module to establish the estimated time required to charge the traction battery to the target state of charge, the estimated time at least partially based on the estimated amount of energy.

9. The method of claim 1, wherein the adjusting comprises charging to reach the target state of charge as a certain time.

10. A charge time estimating system, comprising:

a traction battery; and at least one control module that establishes an estimated time required to charge the traction battery using a first strategy when a target state of charge for a traction battery is a full charge, and that establishes the estimated time required to charge the traction battery using a different, second strategy when the target state of charge for the traction battery is less than a full charge, the at least one control module configured to control a charge of the traction battery based on the estimated charge time.

11. The system of claim 10, wherein the full charge is a one-hundred percent state of charge.

12. The system of claim 10, wherein, when using the first strategy, the at least one control module establishes the estimated time required to charge the traction battery by estimating an amount of energy required to charge a traction battery, subtracting calibrated energy losses from an amount of incoming charging power to establish an available charging power, and dividing the amount of energy by the available charging power.

13. The system of claim 10, wherein the at least one control module is a first control module and further comprising a second control module, wherein, when using the second strategy, the first control module establishes the estimated time based on an estimated amount of energy that is needed to charge the traction battery to the target state of charge, wherein the estimated amount of energy is communicated to the first control module from the second control module, wherein the second control module establishes the estimated amount of energy based on the target state of charge.

14. The system of claim 13, wherein, when using the second strategy, the first control module communicates the target state of charge to the second control module.

15. The system of claim 13, wherein the first control module is outside an enclosure of the traction battery, and the second control module is inside the traction battery.

16. The system of claim 13, wherein the first control module is a hybrid powertrain control module.

17. The system of claim 13, wherein the second control module is a battery energy control module.

18. The system of claim 13, wherein the target state of charge is less than a full charge.

19. The system of claim 13, further comprising a display that shows an actual state of charge of the traction battery.

20. The system of claim 13, further comprising an electrified vehicle having the traction battery and the at least one control module.

* * * * *